(12) United States Patent
Colgan et al.

(10) Patent No.: US 7,079,393 B2
(45) Date of Patent: Jul. 18, 2006

(54) FLUIDIC COOLING SYSTEMS AND METHODS FOR ELECTRONIC COMPONENTS

(75) Inventors: Evan G. Colgan, Chestnut Ridge, NY (US); Frank L. Pompeo, Redding, CT (US); Glenn G. Daves, Fishkill, CT (US); Hilton T. Toy, Hopewell Junction, NY (US); Bruce K. Furman, Poughquag, NY (US); David L. Edwards, Poughkeepsie, NY (US); Michael A. Gaynes, Vestal, NY (US); Mukta G. Farooq, Hopewell Junction, NY (US); Sung K. Kang, Chappaqua, NY (US); Steven P. Ostrander, Poughkeepsie, NY (US); Jaimal M. Williamson, Wappingers Falls, NY (US); Da-Yuan Shih, Poughkeepsie, NY (US); Donald W. Henderson, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 10/904,555

(22) Filed: Nov. 16, 2004

(65) Prior Publication Data
US 2006/0104031 A1 May 18, 2006

(51) Int. Cl.
*H05K 7/20* (2006.01)
(52) U.S. Cl. ............... 361/699; 257/714; 165/80.4; 174/15.1
(58) Field of Classification Search ............. 361/699; 257/715; 165/80.4; 174/15.1
See application file for complete search history.

(56) References Cited

U.S. PATENT DOCUMENTS

| 4,072,188 | A   |   | 2/1978  | Wilson et al.          |
|-----------|-----|---|---------|------------------------|
| 4,381,032 | A   |   | 4/1983  | Cutchaw                |
| 4,561,040 | A   |   | 12/1985 | Eastman et al.         |
| 4,619,316 | A   |   | 10/1986 | Nakayama et al.        |
| 4,721,996 | A   |   | 1/1988  | Tustaniwskyj et al.    |
| 4,750,086 | A   |   | 6/1988  | Mittal                 |
| 5,168,348 | A   |   | 12/1992 | Chu et al.             |
| 5,768,103 | A   | * | 6/1998  | Kobrinetz et al. ........ 361/699 |
| 5,907,473 | A   |   | 5/1999  | Przilas et al.         |
| 6,104,610 | A   | * | 8/2000  | Tilton et al. ............. 361/699 |
| 6,156,165 | A   |   | 12/2000 | Pierson et al.         |
| 6,397,932 | B1  |   | 6/2002  | Calaman et al.         |
| 6,423,566 | B1  |   | 7/2002  | Feger et al.           |
| 6,498,725 | B1  | * | 12/2002 | Cole et al. ............... 361/700 |
| 6,587,345 | B1  |   | 7/2003  | Chu et al.             |
| 6,771,500 | B1  | * | 8/2004  | Siegel et al. ............. 361/699 |
| 6,919,231 | B1  | * | 7/2005  | Ramanathan et al. ....... 438/122 |
| 6,952,346 | B1  | * | 10/2005 | Tilton et al. ............. 361/699 |

* cited by examiner

Primary Examiner—Boris Chervinsky
(74) Attorney, Agent, or Firm—Ohlandt, Greeley, Ruggiero & Perle, L.L.P.; Joseph P. Abate, Esq.

(57) ABSTRACT

A cooling system for an electronic component on a component carrier is provided. The system includes a frame, a spray manifold, and a sealing member. The frame has an opening and is connectable to the component carrier so that an annular area is defined between the opening and the electronic component. The spray manifold is sealed over the opening to define a spray area over a back surface of the electronic component. The spray manifold sprays a cooling fluid on the back surface. The sealing member seals the annular region so that input/output connectors on the component carrier are isolated from the cooling fluid.

21 Claims, 3 Drawing Sheets

FLUIDIC COOLING SYSTEMS AND METHODS FOR ELECTRONIC COMPONENTS

BACKGROUND OF INVENTION

1. Field of the Invention

The present disclosure relates to electronic components. More particularly, the present disclosure relates to electronic components having fluidic cooling systems and methods.

2. Description of Related Art

Electronic devices, such as computers, cell phones, network servers, and others, include a number or plurality of electronic components. Many of these electronic components, such as integrated circuit chips, resistors, capacitors, and others, generate heat during use.

The amount of heat generated is typically proportional to the speed or power of the electronic component. The heat generated by components having a large power density level can be destructive or damaging to the electronic component and/or to other parts of the electronic device. Thus, the removal and/or dissipation (hereinafter "removal") of this heat is often desired.

The consumer acceptance of many electronic devices is affected by the size and functionality of the device. Here, smaller devices and devices with more functionality are generally more desired by the consumer. The electronic components in these devices are therefore being made smaller and more powerful, which can increase the difficulty of providing adequate cooling.

Adequate heat removal from these electronic components is critical in order to maintain performance and reliability of the electronic device. However, it is becoming increasingly difficult to cool high-power density components with prior conduction and convection thermal management cooling techniques.

It has been proposed to secure a heat sink disposed in a thermally conductive manner to a back surface of the electronic component. Natural and/or forced convection of air or cooling fluid is then used to remove heat from the heat sink. A thermal interface material, such as thermal paste, used to secure the heat sink to the electronic component. Unfortunately, this thermal interface material and the heat sink can increase the thermal resistance of the electronic component. Accordingly, these prior systems have not proven effective for cooling smaller, more powerful electronic components.

It has also been proposed to submerge the entire electronic component in a bath of flouronic cooling fluid. Unfortunately, the specialized cooling fluid and design requirements necessary for such systems have proven difficult to achieve and proven not economically viable for smaller consumer devices.

Accordingly, there is a continuing need for cooling systems and methods for electronic components.

BRIEF SUMMARY OF THE INVENTION

It is an object of the present disclosure to provide an electronic component having systems and methods for fluidic cooling of the electronic component.

It is another object of the present disclosure to provide a reliable sealing structure for an electronic component to allow cooling fluid to be sprayed directly over the components back surface, yet provide a barrier so as to not let the cooling fluid contact the connections on the front surface of the component.

It is yet another object of the present disclosure to provide a fluid isolation system for electronic components. The isolation module affords long term environmental protection from direct spraying of a cooling fluid on a portion of the electronic component.

These and other objects and advantages of the present disclosure are provided by a cooling system for an electronic component on a component carrier. The system includes a frame, a spray manifold, and a sealing member. The frame has an opening and is connectable to the component carrier so that an annular area is defined between the opening and the electronic component. The spray manifold is sealed over the opening to define a spray area over a back surface of the electronic component. The spray manifold sprays a cooling fluid on the back surface. The sealing member seals the annular region so that input/output connectors on the component carrier are isolated from the cooling fluid.

These and other objects and advantages of the present disclosure are also provided by a method of cooling an electronic component disposed on a component carrier. The method includes spraying a flow of cooling fluid directly on substantially all of a back surface of the electronic component while preventing the flow of cooling fluid from contacting input/output connectors on the component carrier.

An electronic component is also provided to achieve these and other objects and advantages of the present disclosure. The component includes a component carrier, an input/output connector, a frame, a spray manifold, and a sealing member. The component carrier is connected to a front surface of the electronic component. The input/output connector is disposed on the component carrier. The frame has an opening and is connected to the component carrier so that an annular area is defined between the opening and a back surface of the electronic component. The spray manifold is sealed over the opening to define a spray area over the back side. The spray manifold sprays a cooling fluid on the back surface in the spray area. The sealing member seals the annular region so that the input/output connector is isolated from the cooling fluid.

The above-described and other features and advantages of the present disclosure will be appreciated and understood by those skilled in the art from the following detailed description, drawings, and appended claims.

DETAILED DESCRIPTION OF THE INVENTION

Figure 1:
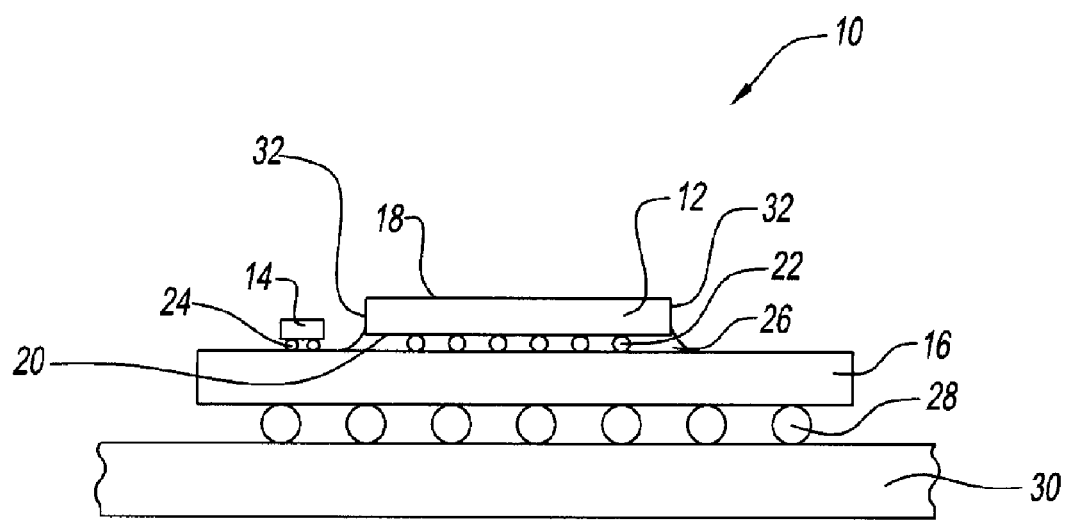
FIG. 1 is a cross-sectional view of a relevant portion of an electronic component for use with the present disclosure.

Referring to the drawings and in particular to FIG. 1, an exemplary embodiment of relevant portions of an electronic component is illustrated by way of reference numeral 10. Electronic component 10 is illustrated by way of example as a single chip module (SCM) package having one or more discrete devices, such as, but not limited to, an integrated circuit chip, a capacitor, a resistor, a memory device, and similar discrete electronic devices.

In FIG. 1, electronic component 10 is illustrated having one integrated circuit chip 12 and one capacitor 14 secured to a chip carrier 16. Chip 12 has a high power density level, namely generates a large amount of heat from a small surface area. In one exemplary embodiment, chip 12 has a power density level of at least about 2 to about 4 watts per square millimeter ($W/mm^2$).

Chip 12 has a front surface 18 and a back surface 20. Front surface 18 is secured to carrier 16 by one or more solder connections 22 so that the chip and carrier are in electrical communication with one another. Similarly, capacitor 14 is secured to carrier 16 by one or more solder connections 24 so that the capacitor and carrier are in electrical communication with one another.

Chip 12 has a generally polygonal shape defining a number or plurality of chip side edges 32, which join front surface 18 to back surface 20. In the illustrated embodiment, chip 12 is shown having a generally square shape with four side edges 32.

In one embodiment, solder connections 22 of chip 12 are encapsulated 26. For example, connections 22 can be encapsulated 26 with, for example, an epoxy material. It has been found that encapsulation 26 can reduce stress on solder connection 22 due to thermal expansion mismatch between chip 12 and carrier 16.

Carrier 16 is a multi-layer ceramic or laminate/organic structure having a number or plurality of input/output (I/O) connectors 28 defined thereon. I/O connectors 28 can be BGA connectors, CGA connectors, LGA connectors, or any combination thereof. I/O connectors 28 are configured to electrically connect carrier 16 a second level package 30, such as an electronic printed circuit board or a card.

Without sufficient cooling for chip 12, the high power density level of the chip can be sufficient to damage electronic component 10. For example, long-term semiconductor performance may be adversely affected above about 105 degrees Celsius to about 120 degrees Celsius if the high, heat flux is not sufficiently mitigated.

Figure 2:
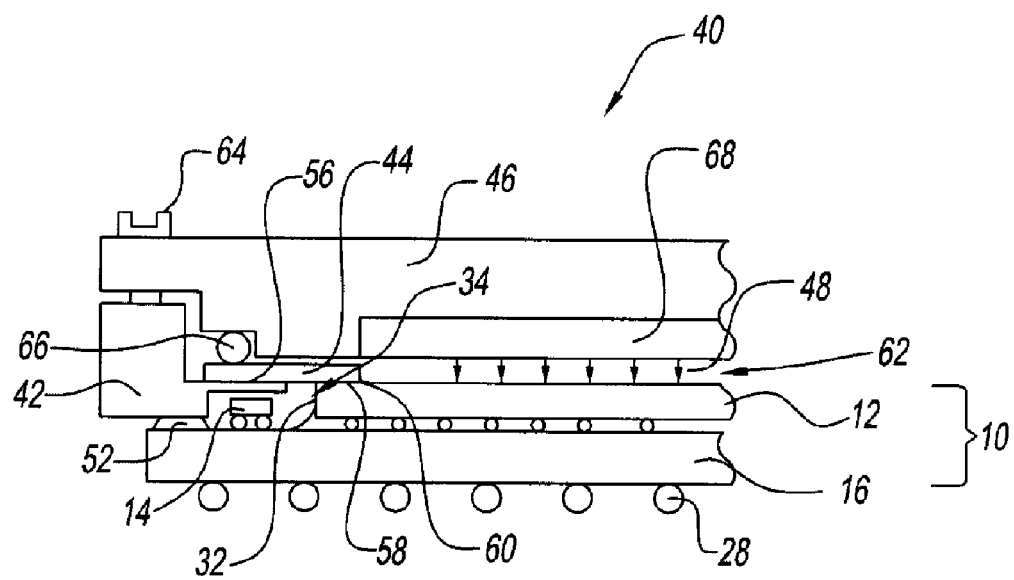
FIG. 2 is a partial cross-sectional view of a first exemplary embodiment of a cooling system according to the present disclosure in use with the electronic component of FIG. 1.
Figure 3:
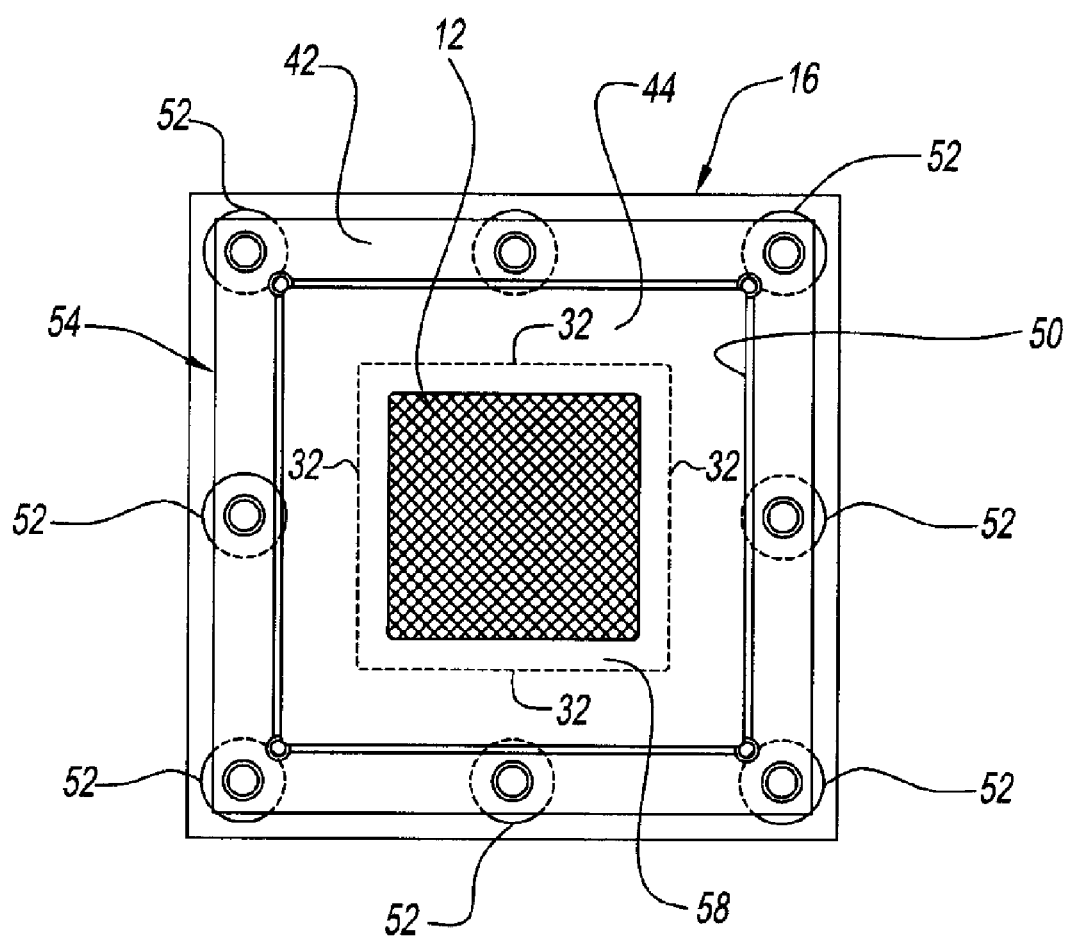
FIG. 3 is a top view of the cooling system of FIG. 2.

Referring now to FIGS. 2 and 3, an exemplary embodiment of a cooling system for electronic component 10 is illustrated by way of reference numeral 40. Advantageously, cooling system 40 is sufficient to mitigate damage to component 10 due to the heat from chip 12. For example, cooling system 40 can remove heat from chip 12 so that the chip remains at less than about 85 degrees Celsius.

Cooling system 40 has frame 42, a flexible member 44, and a spray manifold 46. Spray manifold 46 is not shown in FIG. 3 for purposes of clarity. In use, spray manifold 46 impinges or sprays (hereinafter "spray") a flow of cooling fluid 48 directly on chip 12, which directly cools the chip. Advantageously, frame 42 and flexible member 44 act together as an isolation member to prevent cooling fluid 48 from contacting I/O connectors 28. In some embodiments, frame 42 and flexible member 44 act together to prevent cooling fluid 48 from contacting other electronic components, such as capacitor 14.

Frame 42 assists in isolating I/O connectors 28 from cooling fluid 48 and provides support for spray manifold 46. Frame 42 has one or more central openings 50 defined therein. Frame 42 is secured to carrier 16 by an adhesive 52 so that an annular area 34 is defined between opening 50 of frame 42 and side edges 32 of chip 12. Adhesive 52 can be any adhesive sufficient to withstand the temperatures and mechanical stresses present. For example, adhesive 52 can be an epoxy adhesive.

Adhesive 52 can be applied in selected areas or spots on the perimeter of frame 42. In this manner, one or more condensation paths 54 (FIG. 3) are defined between frame 42 and carrier 16. Condensation paths 54 allow ambient air to circulate between frame 42 and carrier 16, which promotes drying of condensed moisture present on the component side of flexible member 44.

Frame 42 can be made of any desired material. In one embodiment, frame 42 is made of materials having a coefficient of thermal expansion that is substantially similar to that of carrier 16. For example, frame 42 can be made of a Kovar alloy material, ceramic material, and others.

Flexible member 44 is secured between frame 42 and chip 12 to prevent cooling fluid 48 from contacting I/O connectors 28 and capacitor 14. Specifically, flexible member 44 overlaps a portion 56 of frame 42 and a portion 58 of chip 12 to define lap joints therebetween.

Portion 58 of flexible member 44 overlaps chip 12 by about 0.5 millimeters to about 1.0 millimeters (mm). It has been found that minimizing portion 58 of overlap maximize the cooling area on back surface 18 of chip 12.

In one embodiment, flexible member 44 is sealed to back surface 18 of chip 12 by an adhesive 60. Adhesive 60 is made of a material that is generally not permeable to cooling fluid 48. Adhesive 60 can be applied in any desired thickness. However, it has been found that minimizing the thickness of adhesive 60 also minimizes the cross-sectional path for moisture permeation. For example, adhesive 60 having a thickness less than about 0.02 mm has been found to minimize moisture permeation through the adhesive. Adhesive 60 can be an epoxy, a polymer, or any combinations thereof.

In an alternate embodiment, flexible member 44 is soldered to back surface 18 of chip 12 (e.g., the solder replaces adhesive 60 described above). Here, back surface 18 of chip 12 and flexible member 44 include corresponding metallized areas (not shown) that can be soldered together. Advantageously, soldering chip 12 and flexible member 44 provides a true metallurgical bond that is impervious to moisture from cooling fluid 48. In addition, soldering chip 12 and flexible member 44 provides a high thermal transfer rate between the chip and the frame.

Flexible member 44 provides sufficient flexibility to compensation for tolerances between chip 12 and frame 42. Also, flexible member 44 is made of a material having a coefficient of thermal expansion that substantially matches that of chip 12 to minimize the stress on adhesive 60. Preferably, flexible member 44 is made of materials and/or coated with a material that can be easily bonded to chip 12. For example, member 44 can be made of Invar which is commercially from Eagle Alloys of Talbott, Tenn.

Frame 42 and flexible member 44 are described herein as separate elements. However, it is contemplated by the present disclosure for the frame and flexible element to be a single unitary member.

Spray manifold 46 is positioned on frame 42 to spray cooling fluid 48 on bach surface 18 of chip 12. Cooling fluid 48 can be any desired fluid, such as, but not limited to water, fluorocarbon liquids, glycol-based fluid, silicon-based fluid, and other cooling fluids. In an exemplary embodiment, cooling fluid 48 is Fluorinert FC43, which is commercially available from The Minnesota Manufacturing and Mining Company (i.e., 3M).

Spray manifold 46 is secured to frame 42 to define a spray area 62 between the spray manifold and back surface 18. Spray manifold 46 can be secured by one or more mechanical fasteners 64 to frame 42. In addition, spray manifold 46 can include a seal 66 positioned over portion 56 of flexible member 44. Thus, flexible member 44, seal 66, and adhesive 60 seal cooling fluid 48 in spray area 62, which isolates the spray area from I/O connectors 28 and capacitor 14.

Seal 66 can be made from any material like that is heat stable at temperatures up to about 260 degrees Celsius and compatible with cooling fluid 48. For example, seal 66 can be a fluorocarbon o-ring.

As is known in the cooling arts, spray manifold 46 can include a fluid inlet, a fluid outlet, a pump, and a heat exchanger. The pump can move cooling fluid 48 between the heat exchanger and spray area 62 via the inlets and outlets to cool chip 12. In some embodiments, spray manifold 46 can include a diversion plate 68 for diverting the flow of cooling fluid 48 in any desired spray pattern.

Figure 4:
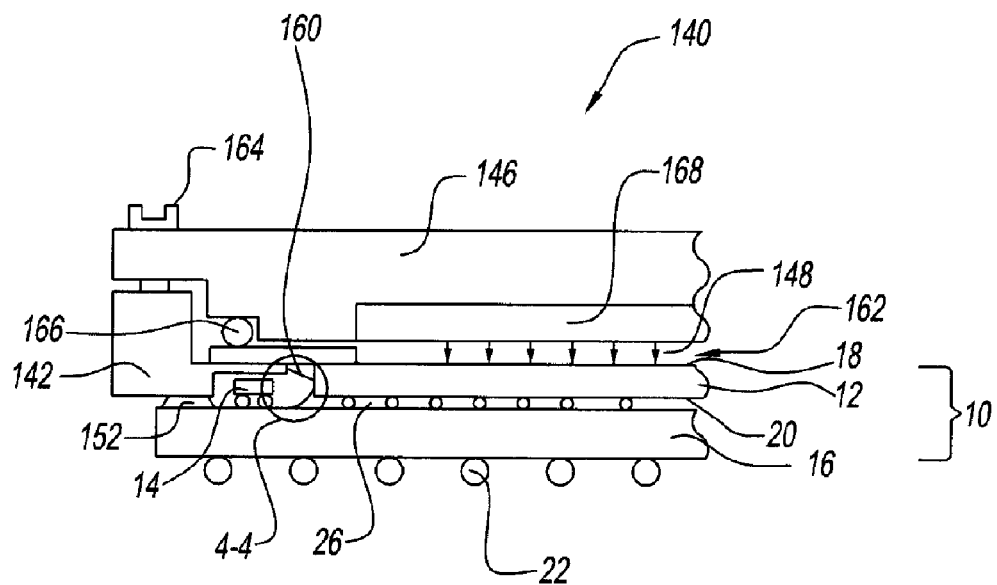
FIG. 4 is a partial cross-sectional view of a second exemplary embodiment of a cooling system according to the present disclosure in use with the electronic component of FIG. 1.
Figure 5:
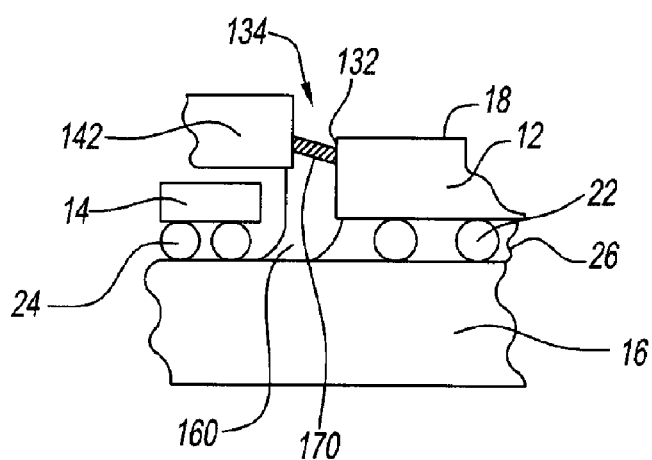
FIG. 5 is a cross-sectional view showing the detail in circle 4—4.

An alternate exemplary embodiment of a cooling system 140 for use with electronic component 10 is described by way of simultaneous reference to FIGS. 4 and 5 in which component parts performing similar and/or analogous functions to those described above are labeled in multiples of one hundred.

Cooling system 140 has frame 142 and a spray manifold 146. Thus, cooling system 140 lacks the flexible member described above. In this embodiment, frame 142 is not sealed against back surface 18 of chip 12. Rather, frame 142 is sealed to side edges 32 of chip 12 by an adhesive 160.

Spray manifold 146 sprays a flow of cooling fluid 148 directly on back surface 18 to cool chip 12 while frame 142 acts as an isolation member to prevent cooling fluid 148 from contacting I/O connectors 28 and/or capacitor 14. It has been found that sealing frame 142 to side edges 32 allows all of back surface 18 to be sprayed with cooling fluid 148. In addition, that sealing frame 142 to side edges 32 can allows the portion of the sides above adhesive 160 to be sprayed with cooling fluid 148.

Frame 142 is secured to carrier 16 by an adhesive 152 so that an annular area 134 is defined between an opening (not shown) in the frame 142 and side edges 32 of chip 12. Adhesive 152 can be applied in selected areas or spots on the perimeter of frame 42 to define one or more condensation paths (not shown).

In one embodiment, frame 142 is sealed to side edges 32 of chip 12 by an adhesive 160. Specifically, adhesive 160 is used to fill annular area 134 between frame 142 and side edges 32 of chip 12. For example, annular area 134 can be about 1.0 millimeter wide between frame 142 and sides 132. Adhesive 160 is made of a material that is generally not permeable to cooling fluid 148. In addition, adhesive 160 is made of a material that has sufficient compliance to handle manufacturing tolerances and thermal expansion differences among chip 12, carrier 16, and frame 142.

Spray manifold 146 is secured to frame 142 to define a spray area 162 between the assembly and back surface 18. Spray manifold 146 can be secured by one or more mechanical fasteners 164 to frame 42. In addition, spray manifold 146 can include a seal 166 positioned between frame 142 and the spray manifold. Thus, frame 142, seal 166, and adhesive 160 seal cooling fluid 148 in spray area 162, which isolates the spray area from I/O connectors 28 and capacitor 14.

In the embodiment illustrated in FIG. 5, adhesive 160 can include a barrier layer 170 disposed thereon. Barrier 170 prevents moisture from cooling fluid 148 from permeating through adhesive 160 overtime. For example, barrier layer 170 can be a metallic film layer, such as a chrome layer applied on the topmost exposed surface of adhesive 160. During manufacture, barrier layer 170 can be applied to adhesive 160 after frame 142 is attached to chip carrier 16 by adhesive 152. Next, adhesive 160 can be subsequently metallized by means of a sputtered, evaporated, or vapor deposited metal film to at least a thickness of approximately 800 Angstroms (Å).

It has been found that the direct fluid cooling of system 40, 140 of the present disclosure provides cooling that is more than twice as efficient as previously systems. For example, heat transfer can generally be represented by the equation: $dT = qR_{total}$, where dT is the temperature difference between the chip and the cooling fluid, q is the chip's power in watts, and $R_{total}$ is the total thermal resistance of package in degrees Celsius per watt. Assuming that dT and q are constant for purposes of comparison, it can be seen that the total thermal resistance is proportional to the thermal efficiency of the cooling system.

In prior systems requiring an air cooled heat sink secured to the chip by thermal paste, the total thermal resistance ($R_{total}$) is represented by the equation: Rtotal=Rchip+Rpaste+Rheatsink+Rconvection. Here, Rchip is the thermal resistance of the chip, RTIM is the thermal resistance of the thermal paste, Rheatsink is the thermal resistance of the heatsink, and Rconvection is the thermal resistance of the air cooled heat sink. In contrast, the total thermal resistance ($R_{total}$) of cooling system 40, 140 according to the present disclosure is represented by the equation: Rtotal=Rchip+Rconvection, where Rchip is the thermal resistance of the chip and Rconvection is the thermal resistance of the direct fluid cooling. A comparison of the thermal resistance of a typical prior system to that of cooling system 40, 140 of the present disclosure can be seen in Table 1.

TABLE 1

| Thermal Resistance of Prior System | | Thermal Resistance of System 40, 140 | |
| --- | --- | --- | --- |
| Rchip = | 6 mm2 C/w | Rchip = | 6 mm2 C/w |
| Rpaste = | 13 mm2 C/w | None | |
| Rheatsink = | 5 mm2 C/w | None | |
| Rconvection = (125,000 w/cm2) | 8 mm2 C/w | Rconvection = (125,000 w/cm2) | 8 mm2 C/w |
| TOTAL = | 32 mm2 C/w | TOTAL = | 14 mm2 C/w |

As can be seen, the thermal resistance of cooling system 40, 140 of the present disclosure provides more than twice as efficient as the prior system.

It should be recognized that cooling system 40, 140 is described herein by way of example isolating a single integrated circuit chip 12. Of course, it is contemplated by the present disclosure for cooling system 40, 140 to find use with any number of integrated circuit chips 12 and/or any number of electronic components 14. For example, it is contemplated for the frame have any desired number of openings 50 for cooling any desired number of electronic components.

Accordingly, the cooling system of the present disclosure isolates the chip connections from the back surface of the chip, while leaving access to the substantially all of the back surface of the chip. This allows the spray manifold to spray the flow of cooling fluid directly on the back surface of the chip, yet provide a barrier so as to not let the cooling fluid contact the connections on the front surface of the chip. Thus, cooling system 40, 140 provides environmental protection for the active and passive metallurgy and other parts, e.g., C4 bumps, chip polyimide, terminal metals, probe pad, of electronic component 10. Further, cooling system 40, 140 finds equal use with leaded and unleaded solder connections.

The terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A cooling system for an electronic component on a component carrier, the system comprising:
   a frame having an opening, said frame being connectable to the component carrier so that an annular area is defined between said opening and the electronic component;
   a spray manifold being sealed over said opening to define a spray area over a back surface of the electronic component, said spray manifold for spraying a cooling fluid on the back surface; and
   a member for sealing said annular area so that input/output connectors on the component carrier are isolated from said cooling fluid.

2. The system of claim 1, wherein said frame is connectable to the component carrier so that at least one condensation path is defined between said frame and the component carrier.

3. The system of claim 1, wherein said member for sealing said annular area comprises a flexible member, said flexible member being overlappable on and sealable to a portion of the back surface and being overlapped on said sealed to a portion of said frame.

4. The system of claim 3, wherein said spray manifold sprays said cooling fluid on substantially all of the back surface.

5. The system of claim 1, wherein the electronic component has a plurality of side edges and wherein said member for sealing comprises an adhesive being disposable in said annular area, sealable to said plurality of side edges, and sealed to said frame.

6. The system of claim 5, wherein said spray manifold sprays said cooling fluid on all of the back surface.

7. The system of claim 5, wherein said spray manifold sprays said cooling fluid on at least a portion of the plurality of side edges.

8. The system of claim 1, further comprising a barrier layer disposed on said adhesive.

9. An electronic component comprising:
   a component carrier being connected to a front surface of the electronic component;
   an input/output connector being disposed on said component carrier;
   a frame having an opening, said frame being connected to said component carrier so that an annular area is defined between said opening and a back surface of the electronic component;
   a spray manifold being sealed over said opening to define a spray area over the back side, said spray manifold for spraying a cooling fluid on the back surface in said spray area; and
   a member for sealing said annular area so that said input/output connector is isolated from said cooling fluid.

10. The component of claim 9, wherein said frame is connected to said component carrier so that at least one condensation path is defined between said frame and said component carrier.

11. The component of claim 9, wherein the electronic component has a power density of at least about 2 watts per square millimeter.

12. The component of claim 11, wherein said spray manifold provides sufficient flow of said cooling fluid to maintain the electronic component at less than about 85 degrees Celsius.

13. The component of claim 9, wherein the electronic component has a power density of at least about 4 watts per square millimeter.

14. The component of claim 13, wherein said spray manifold provides sufficient flow of said cooling fluid to maintain the electronic component at less than about 85 degrees Celsius.

15. The component of claim 9, wherein said member for sealing said annular area comprises a flexible member, said flexible member being overlapped on and sealed to a portion of the back surface and being overlapped on said sealed to a portion of said frame.

16. The component of claim 15, wherein said spray manifold sprays said cooling fluid on substantially all of the back surface.

17. The component of claim 9, wherein the electronic component has a plurality of side edges and wherein said member for sealing comprises an adhesive being disposed in said annular area and sealing the plurality of side edges to said frame.

18. The component of claim 17, wherein said spray manifold sprays said cooling fluid on all of said back surface.

19. The component of claim 17, wherein said spray manifold sprays said cooling fluid on at least a portion of said plurality of side edges.

20. The component of claim 17, further comprising a barrier layer disposed on said adhesive.

21. The component of claim 9, wherein the electronic component is selected from the group consisting of an integrated circuit chip, a capacitor, a resistor, a memory device, and any combinations thereof.

* * * * *